(12) United States Patent
Fields et al.

(10) Patent No.: US 7,053,714 B1
(45) Date of Patent: May 30, 2006

(54) METHODS AND APPARATUS FOR SWITCHING BETWEEN CLASS A AND A/B OPERATION IN A POWER AMPLIFIER

(75) Inventors: John Calvin Fields, Meridian, MS (US); Hartley D. Peavey, Meridian, MS (US)

(73) Assignee: Peavey Electronics Corporation, Meridian, MS (US)

( * ) Notice: Subject to any disclaimer, the term of this patent is extended or adjusted under 35 U.S.C. 154(b) by 0 days.

(21) Appl. No.: 11/248,533

(22) Filed: Oct. 12, 2005

(51) Int. Cl.
*H03F 3/26* (2006.01)
(52) U.S. Cl. ..................................... 330/276; 330/165
(58) Field of Classification Search ................ 330/276, 330/165, 251, 207 A, 311
See application file for complete search history.

(56) References Cited

U.S. PATENT DOCUMENTS 3,898,575 A * 8/1975 Koch .......................... 330/271
6,323,733 B1 * 11/2001 Gorcea et al. .............. 330/297

* cited by examiner

*Primary Examiner*—Henry Choe
(74) *Attorney, Agent, or Firm*—KaplanGilmanGibson & DernierLLP

(57) ABSTRACT

Methods and apparatus contemplate: an output transformer having at least first and second separate primary windings and at least one secondary winding, each winding including a first (in phase) end and a second (out of phase) end; at least first and second active elements, each having at least a pair of power terminals and a control terminal, one power terminal of each active element being coupled to a common node; and a switching circuit operable to change a circuit configuration of the first and second primary windings and the active elements between a class A mode and a class A/B mode.

19 Claims, 6 Drawing Sheets

METHODS AND APPARATUS FOR SWITCHING BETWEEN CLASS A AND A/B OPERATION IN A POWER AMPLIFIER

BACKGROUND OF THE INVENTION

The present invention relates to methods and apparatus for selectively changing a circuit configuration of a power amplifier stage, e.g., for a guitar amplifier, between class A and class A/B.

Designers of guitar amplifiers, up until the late 1950's, focused on creating inexpensive amplifiers with very little distortion. This was not an easy task as solid state devices were not generally available and nearly all amplifiers were designed and built using vacuum tubes. Although tube amplifiers inherently have more distortion than solid state amplifiers, the early amplifier pioneers tried in vain to produce amplifiers with little or no distortion. Most of their designs had a high order of distortion, especially second harmonic distortion, because of the fact that most used a Class A power amplifier topology.

In the context of electric guitar amplification, the existence of harmonic distortion in the amplifier is not undesirable. Indeed, it has been generally thought that even order harmonics are pleasing to the ear, (especially the second harmonic), while odd order harmonics are thought to sound "raucous," "raspy," and unpleasant, especially the third and fifth harmonics. The desirability of even order harmonics appears to hold even in fairly high ratios to the normal (undistorted) signal.

As most rock guitar players use solid body guitars, which provide relatively little resonance, most of the harmonics associated with the characteristic sounds identifiable as an electric guitar actually come from the amplifier and not the guitar. The harmonics introduced by the guitar amplifier differentiate one guitar system (e.g., guitar and amplifier combination) from another, thereby giving each system its own "personality." Thus, guitar amplification has become a niche technology within the broader universe of the audio amplification arts. What sets a guitar amplifier apart from an amplifier found in, for example, a sound system or a home stereo is that the latter seeks to reproduce sounds as closely as possible to the input signal, while the former significantly alters the sound and is, in essence, an extension of the instrument and a part of an overall guitar system.

For efficiency, transformer design, and other cost considerations, most high-power tube type guitar amplifiers utilize push-pull output stages operating in class A/B. The A/B class dictates that the output signal is shared by two or more output tubes which are driven by signals that are equal in magnitude and 180 degrees out of phase. In contrast, class A amplifiers are typically single-ended and are driven from a single drive signal. When driven into clipping, a class A amplifier produces an output rich in second order harmonics, which as discussed above is generally considered to be desirable. Unfortunately, a class A/B power amplifier can produce an output rich in odd order harmonics (in addition to some even order harmonics), which is not considered as desirable.

While the design of a class A/B amplifier in accord with conventional wisdom may be acceptable to some users, many guitar players may find the odd-order harmonic content objectionable. It would be desirable, therefore, to provide an amplifier that can be selectively switched between class A and class A/B operation so that either of the following results can be obtained: (i) efficient amplification (at the expense of harmonic content); or (ii) desirable harmonic content (at the expense of efficiency). Finding circuit solutions to achieve selective switching between class A and class A/B operation is not trivial. Indeed, cost, product size and circuit performance may be significantly impacted by the circuit implementation and control methodology employed. It has been discovered that desirable results in cost, size and performance may be achieved employing one or more aspects of the various embodiments of the invention as described and claimed herein.

SUMMARY OF THE INVENTION

In accordance to one or more aspects of the present invention, methods and apparatus provide for: providing an output transformer having at least first and second separate primary windings and at least one secondary winding, each winding including a first (in phase) end and a second (out of phase) end; providing at least first and second active elements, each having at least a pair of power terminals and a control terminal; and selectively changing a circuit configuration of the first and second primary windings and the active elements between a class A mode and a class A/B mode.

Various embodiments of the invention may include an apparatus, comprising: an output transformer having at least first and second separate primary windings and at least one secondary winding, each winding including a first (in phase) end and a second (out of phase) end; at least first and second active elements, each having at least a pair of power terminals and a control terminal, one power terminal of each active element being coupled to a common node; and a switching circuit operable to change a circuit configuration of the first and second primary windings and the active elements between a class A mode and a class A/B mode.

The switching circuit may be operable to couple the first and second primary windings in series when in the class A/B mode. For example, the switching circuit may be operable to couple the active elements and the first and second primary windings in a push-pull output configuration when in the class A/B mode. Preferably, the switching circuit is operable such that in the class A/B mode, the other power terminal of the first active element is coupled to the first end of the first primary winding, the other power terminal of the second active element is coupled to the second end of the second primary winding, and the second end of the first primary winding is coupled to the first end of the second primary winding.

Additionally, the switching circuit may be operable to couple the first and second primary windings in parallel when in the class A mode. Additionally, the switching circuit is preferably operable to couple the first and second active elements in parallel when in the class A mode. For example, the switching circuit may be operable to couple the first and second active elements and the first and second primary windings in a single-ended output configuration when in the class A mode. Preferably, the switching circuit is operable such that in the class A mode, the first and second primary windings are coupled in parallel, and the first and second active elements are coupled in parallel such that the other power terminals thereof are coupled to the first ends of the primary windings.

The apparatus may also include a driver circuit operable to receive an input signal and produce: first and second drive signals therefrom, each about 180 degrees out of phase with respect to the other, for the respective control terminals of the first and second active elements when in the class A/B mode; and a single-phase drive signal for both the control terminals of the first and second active elements when in the class A mode. Preferably, the switching circuit is operable to control the configuration of the driver circuit into the respective class A/B and class A modes.

The switching circuit is preferably user-controllable to permit the user to select the mode of operation.

In an alternative embodiment, the active elements may be tubes and the apparatus may further include a selectively configurable bias circuit operable to selectively provide: (i) self bias to the control terminals of the first and second tubes; or (ii) a fixed negative bias to the control terminals of the first and second tubes.

Other aspects, features, and advantages of the present invention will be apparent to one skilled in the art from the description herein taken in conjunction with the accompanying drawings.

DESCRIPTION OF THE DRAWINGS

For the purposes of illustration, there are forms shown in the drawings that are presently preferred, it being understood, however, that the invention is not limited to the precise arrangements and instrumentalities shown.

DETAILED DESCRIPTION OF THE PREFERRED EMBODIMENTS

Figure 1:
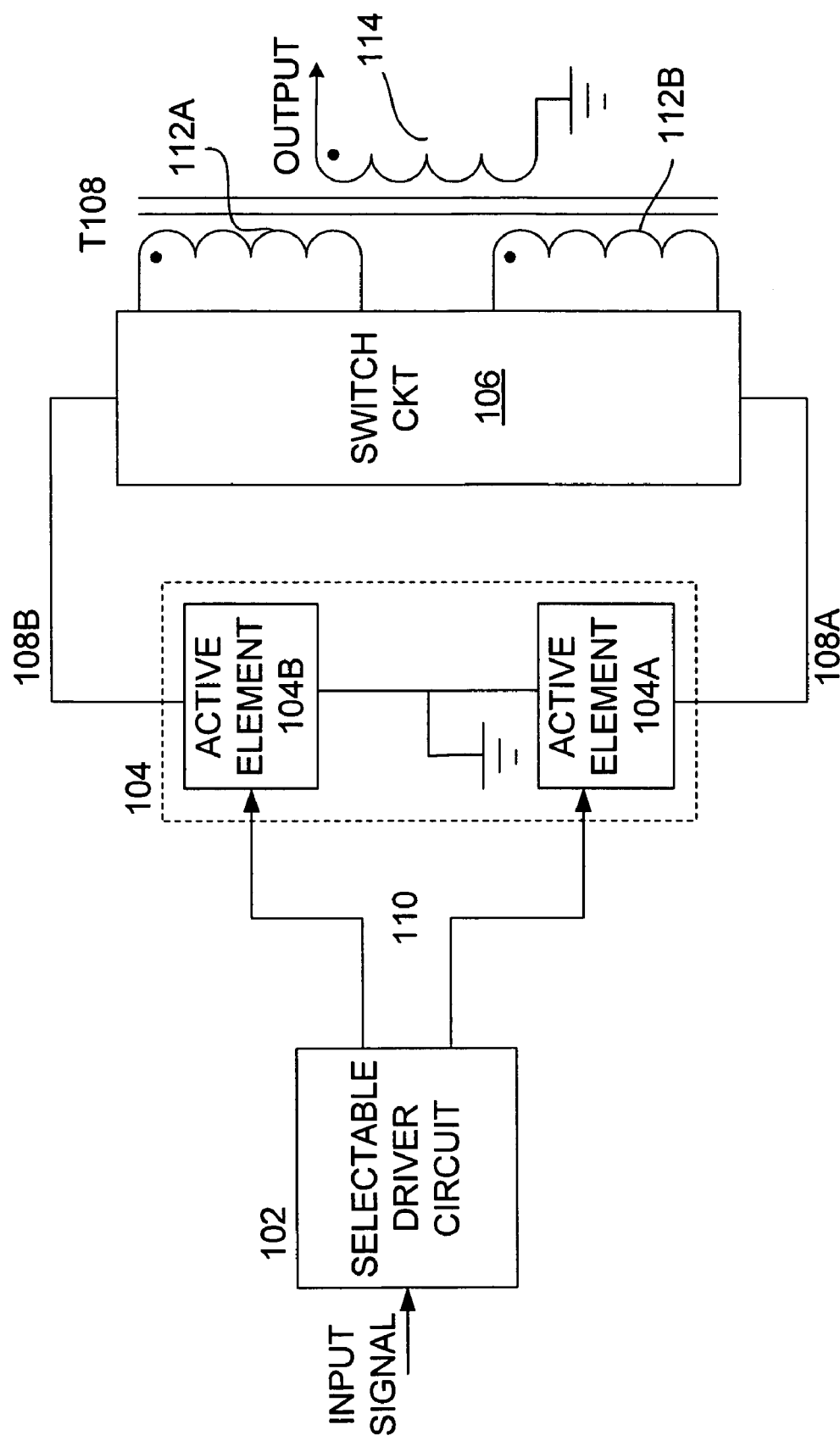
FIG. 1 is a block diagram of an amplifier circuit that is operable to provide selective operation in class A or class A/B modes in accordance with one or more aspects of the present invention.

With reference to the drawings wherein like numerals indicate like elements, there is shown in FIG. 1 a block diagram of an amplifier circuit 100 that is operable to provide selectability in the topology class of the amplifier: between class A operation and class A/B operation in accordance with one or more aspects of the present invention. The amplifier circuit 100 includes a selectable driver circuit 102, a power amplifier stage 104, a switching circuit 106, and an output transformer stage 108.

The selectable driver circuit 102 is preferably operable to receive an input signal (such as from upstream circuitry of an electric guitar preamplifier) and to produce one or more drive signals 110 suitable for biasing at least the active components of the power amplifier stage 104. As will be discussed in more detail herein below, the selectable driver circuit 102 is operable to produce a single-phase drive signal 110 for class A operation or first and second drive signals (each about 180 degrees out of phase) for class A/B operation, depending on the user selectable operational mode.

In the embodiment shown in FIG. 1, the power amplifier 104 includes a first active element 104A and a second active element 104B. Those skilled in the art of power amplifier design will appreciate that there may be numerous components within each of the active elements 104A, 104B, although for the purposes of brevity and clarity, the active elements 104A, 104B will be referred to herein in the singular. As will be discussed in more detail below, depending on the state of the switching circuit, which bridges the connections between the power amplifier stage 104 and the output stage 108, the circuit connections involving the active elements 104A, 104B are adjustable in accordance with the selected mode of operation.

The output stage 108 preferably includes a multi-winding transformer T108, which includes at least first and second separate primary windings 112A, 112B and at least one secondary winding 114. Each winding 112A, 112B, and 114 preferably includes a first (in phase) end and a second (out of phase) end, where the in phase ends are indicated using conventional "dot" labeling. It is a notable feature of this embodiment of the present invention that the transformer T108 includes two separate primary windings 112A and 112B; indeed, as will be discussed below, this provide advantageous cost, size and performance advantages.

Figure 2A:
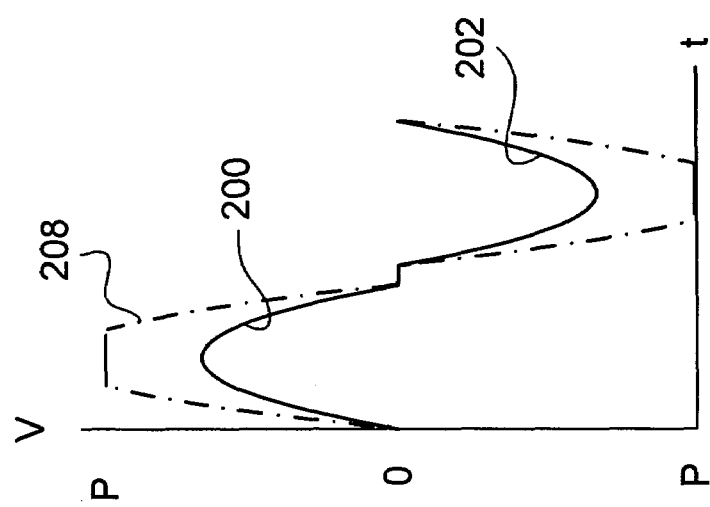
FIGS. 2A–B are graphical representations of the operation of the circuit of FIG. 1 in each mode, including clipping distortion.
Figure 2B:
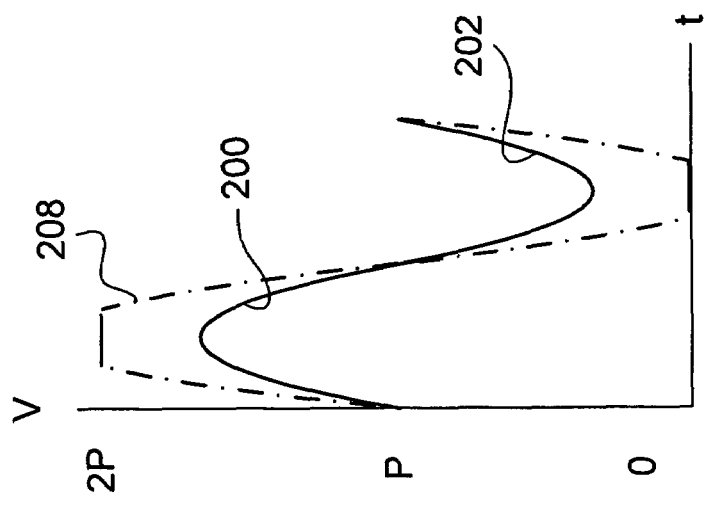

In accordance with one or more aspects of the present invention, the switching circuit 106 is preferably operable to change the circuit configuration of the first and second primary windings 112A, 112B and the active elements 104A, 104B between a class A mode and a class A/B mode. This is graphically illustrated in FIGS. 2A and 2B. It is assumed for the purposes of discussion that the input signal to the amplifier circuit 100 is a sine wave having substantially zero DC content. The graphs of FIGS. 2A–2B represent the output signal produced by the output stage 108 in response to such sine wave. In FIG. 2A, which illustrates class A operation, the upward swing 200 and downward swing 202 of the output signal are above zero, symmetrical about potential P, and peak at 2P and zero, respectively. When the output signal is driven into clipping 208, the resulting distortion is rich in even-order harmonics, particularly second order harmonics. In FIG. 2B, which illustrates class A/B operation, the upward swing 200 of the output signal is above zero, the downward swing 202 is below zero, and they peak at P. Note that class A/B operation usually includes some cross-over distortion as the waveform transitions through zero. When the output signal is driven into clipping, the resulting distortion includes even-order harmonics and odd-order harmonics.

Figure 3:
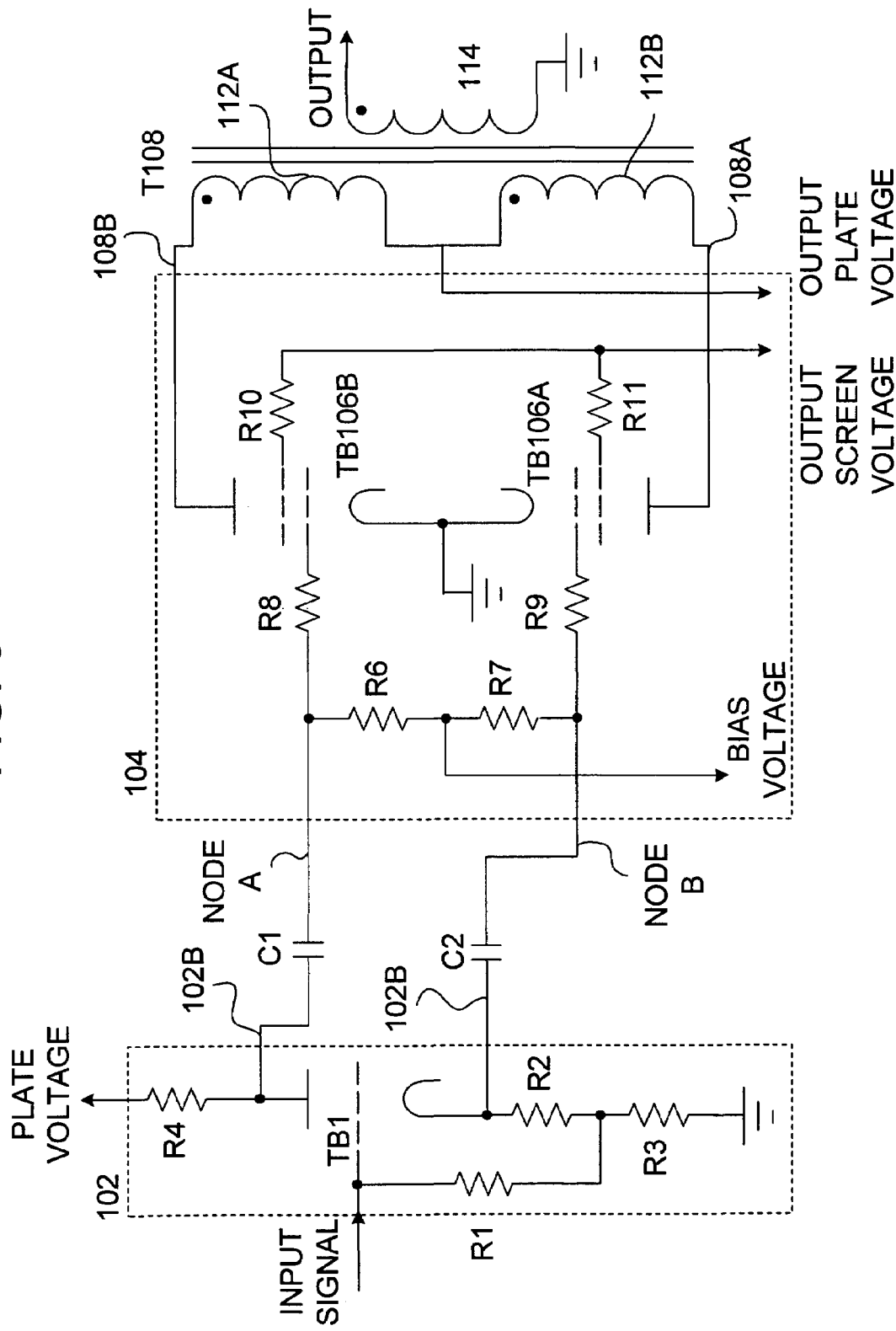
FIG. 3 is a schematic diagram of one embodiment of the circuit of FIG. 1 in the class A/B mode of operation.

With reference to FIG. 3, the switching circuit 106 is preferably operable to couple the active elements 104A, 104B and the first and second primary windings 112A, 112B in a push-pull output configuration when the class A/B mode is selected. FIG. 3 illustrates the circuit topology after the switching circuit has been activated in the class A/B mode. By way of example, the active elements 104A, 104B are shown as being implemented using vacuum tubes TB104A, TB104B. The tubes TB104A, TB104B each have at least a pair of power terminals (plate and cathode), and at least one control terminal (one or more grids). The cathodes of each tube TB104A, TB104B are coupled to a common node, such as ground.

Notably, the switching circuit 106 operates such that, in the class A/B mode, the primary windings 112A, 112B are coupled in series with the active elements TB104A, TB104B, which are also in series. In particular, the plate terminal of the tube TB104A is coupled to the first end of the first primary winding 112A, the plate terminal of the other tube TB104B is coupled to the second end of the second primary winding 112B, and the second end of the first primary winding 112A is coupled to the first end of the second primary winding 112B. The common connection node of the first and second primary windings 112A, 112B of the transformer T108 is coupled to the output plate voltage supply, which may be on the order of about 150–500 VDC. Those skilled in the art will recognize that that the series coupled primary windings 112A, 112B of the transformer T108 represent a substantial departure from the conventional transformer configuration for class A/B power amplifiers; indeed, conventional wisdom dictates that a center-tapped single primary winding is used.

The respective grids of the tubes TB104A, TB104B are biased at a potential below the respective cathodes by way of a negative bias voltage and bias resistors R6, R7, R8 and R9. The screens of the tubes TB104A, TB104B are biased by way of an output screen voltage supply and resistors R10, R11. It is noted that the screens are preferably biased slightly lower than the plate voltage of the tubes TB104A, TB104B, to as low as about one half of the plate voltage. The output signal is taken at the secondary winding 114 of the transformer T108.

In operation, the grids of the tubes TB104A, TB104B receive the drive signals on node A and node B, respectively. Assuming a sine wave input signal, the drive signals on nodes A and B will be sine waves 180 degrees out of phase with one another. Thus, when the sine wave on node A is positive going, tube TB104A will be biased ON and draw current through the primary winding 112A of the transformer T108 in proportion with the magnitude of the node A drive signal. At the same time, the sine wave on node B will be negative going and the tube TB104B will be biased OFF. This results in a positive going portion of a sine wave on the output of the transformer T108. When the sine wave on node A is negative going, the sine wave on node B is positive going and the tube TB104B will be biased ON and draw current through the other primary winding 112B of the transformer T108 in proportion with the magnitude of the node B drive signal. The negative going sine wave on node A will bias the tube TB104B OFF. This results in a negative going portion of a sine wave on the output of the transformer T108.

As discussed above, the selectable driver circuit 102 is preferably operable to produce first and second drive signals 102A, 102B (each about 180 degrees out of phase from one another) for class A/B operation. As shown, the phase inverter 102 may be implemented utilizing a tube TB1, and a plurality of resistors R1–R4. An input resistor R1 is coupled between a grid of the tube TB1 and a common node of a resistor divider circuit formed by resistors R2, R3 coupled in series from the cathode of the tube TB1 to ground. The plate of the tube TB1 is coupled to a plate voltage through resistor R4. The plate voltage may be on the order of about 150–400 VDC. Output from the phase inverter 102 is taken at the cathode and the plate, respectively.

The basic operation of the phase inverter 102 in class A/B operation is as follows: Positive and negative swings in the input signal vary the grid voltage with respect to the cathode voltage such that corresponding variations in the current through the tube TB1 are achieved. The current gain through the tube TB1 is inversely proportional to the combined series resistance of R2 and R3. The variations in the current through the tube TB1 result in a varying voltage across R4 (the output of which is taken at the plate) and a varying voltage across the combined resistance of R2 and R3 (the output of which is taken at the cathode). Assuming that resistor R4 is of a value substantially equal to the combined resistances of resistors R2 and R3, then the respective magnitudes of the first and second drive signals on lines 102A and 102B will be balanced, although these drive signals will be 180° out of phase with respect to one another. Referring again to FIG. 2B, when the drive signals on lines 102A, 102B are balanced, the output signal includes a positive going portion 200 and a negative going portion 202 that are balanced and symmetrical about zero voltage potential.

Figure 4:
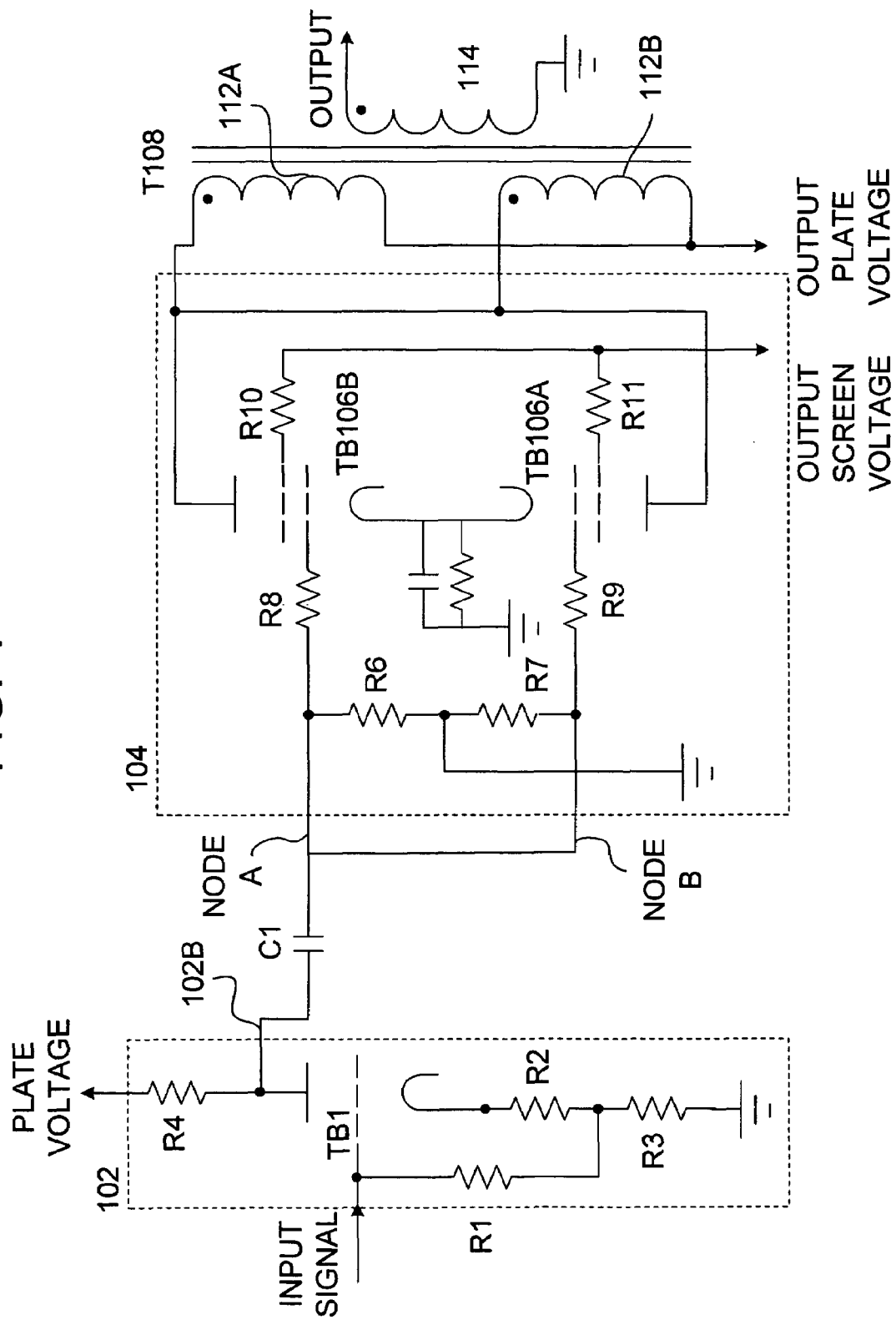
FIG. 4 is a schematic diagram of one embodiment of the circuit of FIG. 1 in the class A mode of operation.

With reference to FIG. 4, the switching circuit 106 is preferably operable to couple the active elements 104A, 104B and the first and second primary windings 112A, 112B in a single-ended output configuration when the class A mode is selected. FIG. 4 illustrates the circuit topology after the switching circuit 106 has been activated in the class A mode. In particular, the first and second primary windings 112A, 112B are coupled in parallel, and the tubes TB104A, TB104B are coupled in parallel such that the plate terminals thereof are coupled to the first ends of the primary windings 112A, 112B. Those skilled in the art will recognize that the parallel coupled primary windings 112A, 112B of the transformer T108 represent a substantial departure from the conventional transformer configuration for class A power amplifiers; indeed, conventional wisdom dictates that a single primary winding is used.

The selectable driver circuit 102 is operable to produce a single-phase drive signal on node A for both grids of the tubes TB104A, TB104B. In the class A mode, the tubes TB104A, TB104B are preferably self biased. With the above configuration, the tubes T104A, T104B are biased ON when not driven into clipping (preferably equally sharing current) and current flows (preferably evenly) through both primary windings 112A, 112B.

Notably, the circuit topology achieved by the switching circuit 106 in the class A mode results in a substantial impedance match as between the active elements 104A, 104B and the primary windings 112A, 112B. Indeed, the parallel orientation of the primary windings 112A, 112B results in a complex impedance of about one half that of the series configuration in the class A/B mode. Advantageously, the parallel orientation of the active elements 104A, 104B in the class A orientation also results in about a halving of the impedance of the series configuration in the class A/B mode. Thus, irrespective of the operating mode, a substantial impedance match as between the active elements 104A, 104B and the primary windings 112A, 112B is achieved, thereby minimizing attenuation through the amplifier stages. Further, the paralleling of the primary windings 112A, 112B in the class A mode ensures full usage of the transformer, including high current handling capability therein, and a high DC saturation level. Thus, the size and cost of the transformer T108 may be minimized despite supporting the dual modes of operation; indeed, the size of the transformer T108 may be no greater than a comparable center tapped primary of the conventional class A/B circuit topology.

Figure 5:
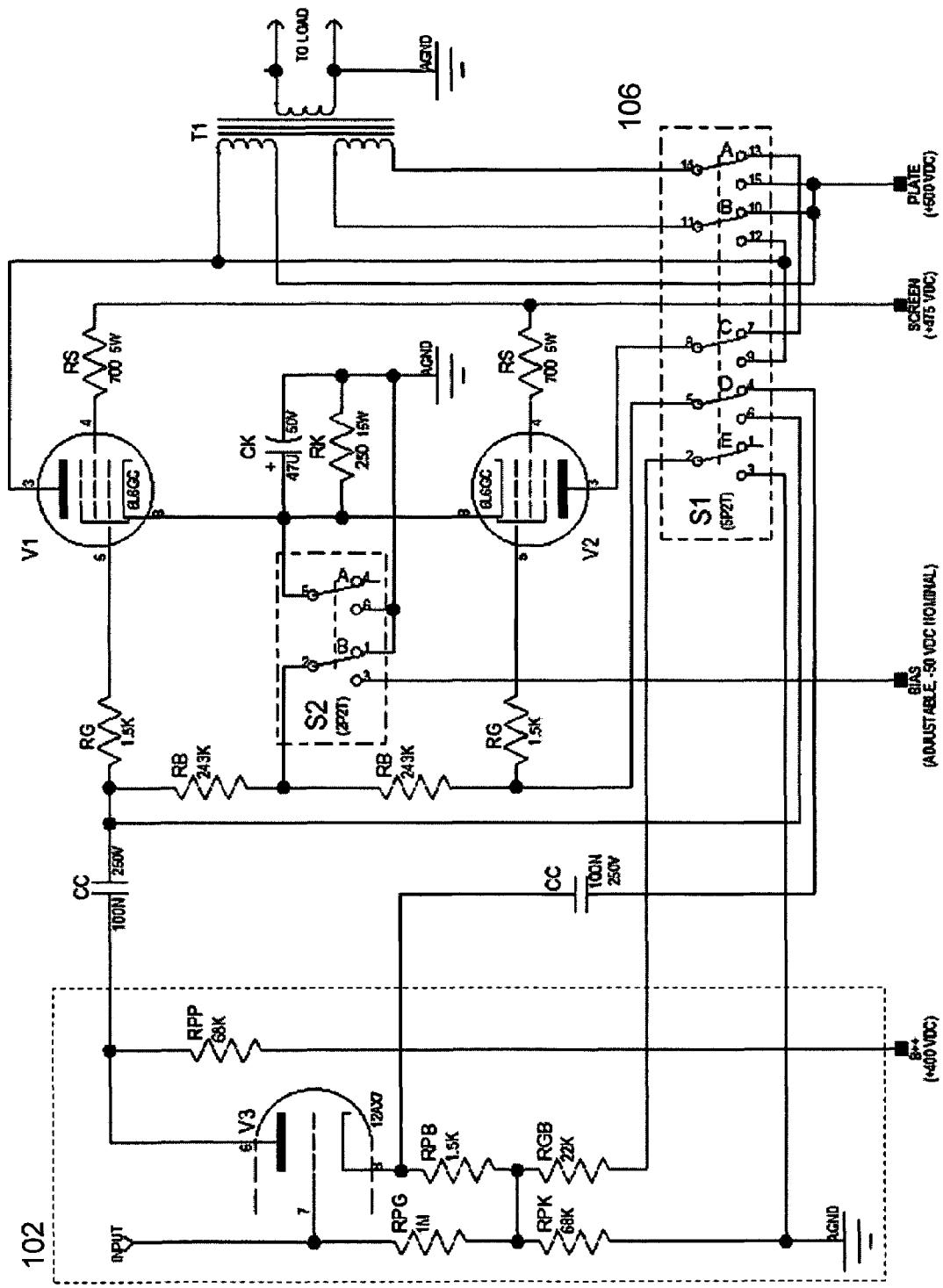
FIG. 5 is a more detailed schematic diagram of one embodiment of the circuit of FIG. 1.

Reference is now made to FIG. 5, which is a more detailed schematic diagram of a suitable circuit example for implementing an embodiment of the circuit of FIG. 1. For the purposes of brevity, a detailed analysis and discussion of all of the circuit components, interconnections, and operations will not be provided here as such will be apparent to those skilled in the art given the description provided herein. Notably, however, the switching circuit 106 may be implemented using a series of single pole double throw (so-called three-way) switches, labeled S1. Switches A, B, and C selectively configure the active elements (tubes V1, V2) and the separate primary windings of the transformer T1 in either the class A or class A/B configurations. Switches D and E configure the driver circuit 102 for the class A or class A/B configurations.

Additionally, the system may include a switching circuit S2 for selectively adjusting the biasing scheme for the tubes V1, V2. In the illustrated switch A and B positions, the tubes V1, V2 are self biased. In the opposite positions, the tubes V1, V2 are fixed biased (although such bias level may be separately adjusted by way of the bias supply).

Figure 6:
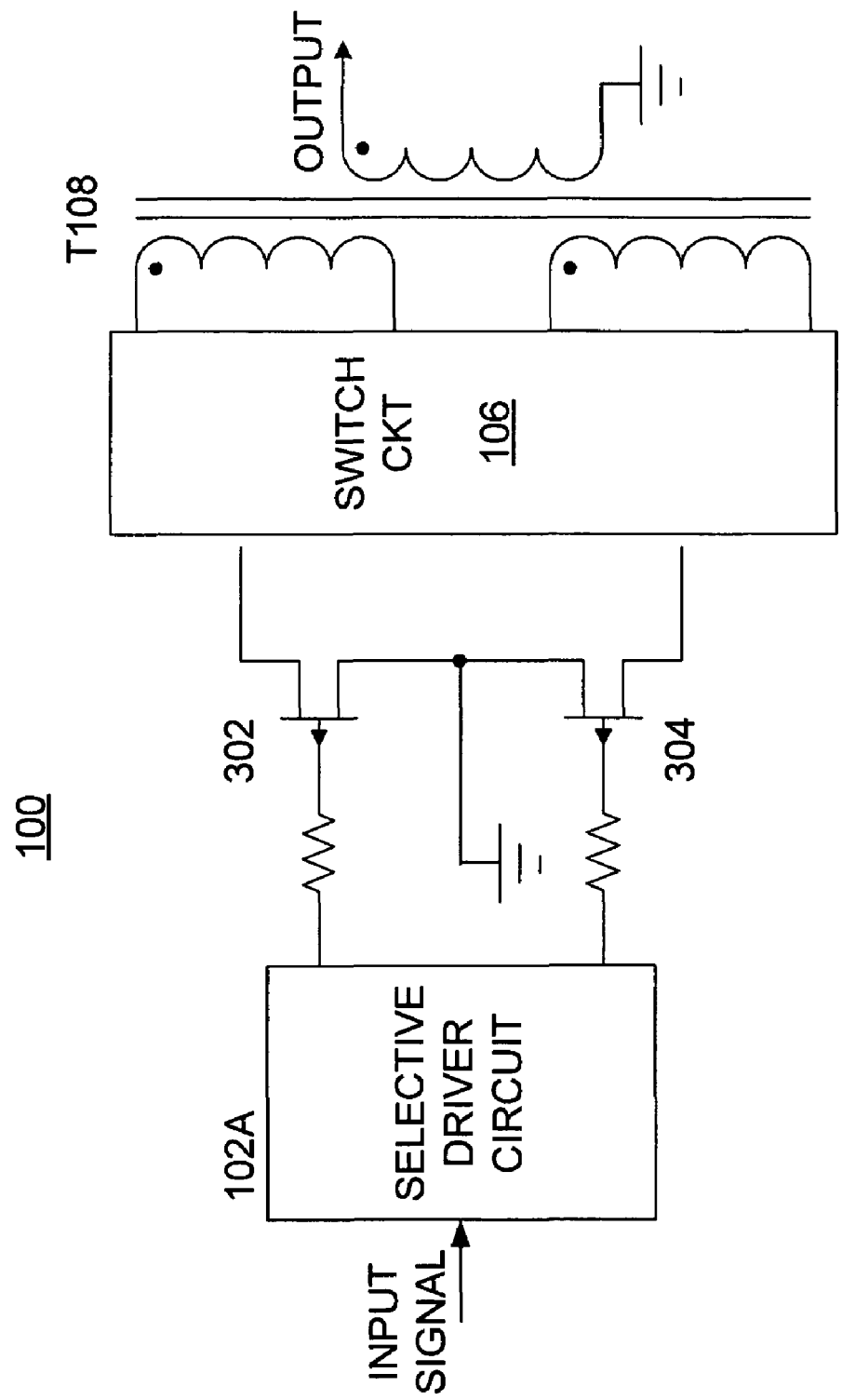
FIG. 6 is a partial block diagram and schematic diagram of an alternative embodiment of a solid state output circuit suitable for implementing at least a portion of the amplifier circuit of FIG. 1.

Those skilled in the art will appreciate that the power amplifier 104 may be implemented utilizing any of the known techniques, such as utilizing tubes, field effect transistors, bipolar transistors, etc. In this regard, reference is made to FIG. 6, which illustrates a power amplifier implemented utilizing field effect transistors 302, 304. This implementation includes an appropriate driver circuit 102A that may receive the input signal and produce appropriate gate drive signals to bias the field effect transistors 302, 304 in an appropriate manner.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus, comprising:
    an output transformer having at least first and second separate primary windings and at least one secondary winding, each winding including a first (in phase) end and a second (out of phase) end;
    at least first and second active elements, each having at least a pair of power terminals and a control terminal, one power terminal of each active element being coupled to a common node; and
    a switching circuit operable to change a circuit configuration of the first and second primary windings and the active elements between a class A mode and a class A/B mode.

2. The apparatus of claim 1, wherein the switching circuit is operable to couple the first and second primary windings in series when in the class A/B mode.

3. The apparatus of claim 2, wherein the switching circuit is operable to couple the active elements and the first and second primary windings in a push-pull output configuration when in the class A/B mode.

4. The apparatus of claim 1, wherein the switching circuit is operable such that in the class A/B mode, the other power terminal of the first active element is coupled to the first end of the first primary winding, the other power terminal of the second active element is coupled to the second end of the second primary winding, and the second end of the first primary winding is coupled to the first end of the second primary winding.

5. The apparatus of claim 1, wherein the switching circuit is operable to couple the first and second primary windings in parallel when in the class A mode.

6. The apparatus of claim 5, wherein the switching circuit is operable to couple the first and second active elements in parallel when in the class A mode.

7. The apparatus of claim 5, wherein the switching circuit is operable to couple the first and second active elements and the first and second primary windings in a single-ended output configuration when in the class A mode.

8. The apparatus of claim 1, wherein the switching circuit is operable such that in the class A mode, the first and second primary windings are coupled in parallel, and the first and second active elements are coupled in parallel such that the other power terminals thereof are coupled to the first ends of the primary windings.

9. The apparatus of claim 1, further comprising a driver circuit operable to receive an input signal and produce:
    first and second drive signals therefrom, each about 180 degrees out of phase with respect to the other, for the respective control terminals of the first and second active elements when in the class A/B mode; and
    a single-phase drive signal for both the control terminals of the first and second active elements when in the class A mode.

10. The apparatus of claim 9, wherein the switching circuit is operable to control the configuration of the driver circuit into the respective class A/B and class A modes.

11. The apparatus of claim 10, wherein:
    the switching circuit is user-controllable to permit the user to select the mode of operation; and
    the switching circuit is operable to substantially simultaneously configure the driver circuit, the transformer and the active elements into the selected mode.

12. The apparatus of claim 1, wherein the switching circuit is user-controllable to permit the user to select the mode of operation.

13. The apparatus of claim 1, wherein the active elements are taken from the group consisting of tubes, field effect transistors and bipolar transistors.

14. The apparatus of claim 1, wherein the active elements are tubes and the apparatus further comprises a selectively configurable bias circuit operable to selectively provide: (i) self bias to the control terminals of the first and second tubes; or (ii) a fixed negative bias to the control terminals of the first and second tubes.

15. A method, comprising:
    providing an output transformer having at least first and second separate primary windings and at least one secondary winding, each winding including a first (in phase) end and a second (out of phase) end;
    providing at least first and second active elements, each having at least a pair of power terminals and a control terminal; and
    selectively changing a circuit configuration of the first and second primary windings and the active elements between a class A mode and a class A/B mode.

16. The method of claim 15, further comprising coupling the first and second primary windings in series when in the class A/B mode.

17. The method of claim 16, further comprising coupling the active elements and the first and second primary windings in a push-pull output configuration when in the class A/B mode.

18. The method of claim 15, further comprising, when in the class A/B mode:
    coupling one power terminal of each active element to a common node;
    coupling the other power terminal of the first active element to the first end of the first primary winding;
    coupling the other power terminal of the second active element to the second end of the second primary winding; and
    coupling the second end of the first primary winding to the first end of the second primary winding.

19. The method of claim 15, further comprising, when in the class A mode, coupling the first and second active elements and the first and second primary windings in a single-ended output configuration such that:
    the first and second primary windings are coupled in parallel; and
    the first and second active elements are coupled in parallel,
    wherein the other power terminals of the first and second active elements are coupled to the first ends of the primary windings.

* * * * *